United States Patent
Cho

(10) Patent No.: US 9,281,306 B2
(45) Date of Patent: *Mar. 8, 2016

(54) MULTI-TRANSISTOR EXPOSED CONDUCTIVE CLIP FOR SEMICONDUCTOR PACKAGES

(71) Applicant: International Rectifier Corporation, El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 384 days.

This patent is subject to a terminal disclaimer.

(21) Appl. No.: 13/727,899

(22) Filed: Dec. 27, 2012

(65) Prior Publication Data

US 2013/0134524 A1 May 30, 2013

Related U.S. Application Data

(63) Continuation of application No. 13/111,712, filed on May 19, 2011, now Pat. No. 8,344,464.

(51) Int. Cl.
| | |
|---|---|
| *H01L 27/088* | (2006.01) |
| *H01L 23/495* | (2006.01) |
| *H01L 23/00* | (2006.01) |
| *H01L 23/051* | (2006.01) |
| *H01L 23/31* | (2006.01) |

(52) U.S. Cl.
CPC ........ *H01L 27/088* (2013.01); *H01L 23/49524* (2013.01); *H01L 23/49541* (2013.01); *H01L 23/49562* (2013.01); *H01L 23/49568* (2013.01); *H01L 23/49575* (2013.01); *H01L 24/34* (2013.01); *H01L 24/73* (2013.01); *H01L 23/051* (2013.01); *H01L 23/3107* (2013.01); *H01L 24/48* (2013.01); *H01L 2224/37147* (2013.01); *H01L 2224/40095* (2013.01); *H01L 2224/40247* (2013.01); *H01L 2224/48091* (2013.01); *H01L 2224/73221* (2013.01); *H01L 2924/014* (2013.01); *H01L 2924/01029* (2013.01); *H01L 2924/01033* (2013.01); *H01L 2924/01082* (2013.01); *H01L 2924/1306* (2013.01); *H01L2924/15787* (2013.01); *H01L 2924/181* (2013.01)

(58) Field of Classification Search
CPC ...................................... H01L 27/088
USPC .................... 257/401, 676, 690–692, E27.06, 257/E23.031
See application file for complete search history.

(56) References Cited

U.S. PATENT DOCUMENTS

| | | | |
|---|---|---|---|
| 6,723,582 B2 | 4/2004 | Glenn | |
| 6,946,740 B2 | 9/2005 | Schaffer | |
| 7,618,896 B2 | 11/2009 | Joshi | |

(Continued)

OTHER PUBLICATIONS

Islam, Nokibul et al., "Molded Flip Chip—FC(M)BGA", pp. 1-5, Mar. 17-20, 2008, Presented at IMAPS International Conference and Exhibition on Device Packaging, Scottsdale, Arizona.

*Primary Examiner* — Cuong Q Nguyen
(74) *Attorney, Agent, or Firm* — Farjami & Farjami LLP

(57) ABSTRACT

One exemplary disclosed embodiment comprises a semiconductor package including multiple transistors coupled to an exposed conductive clip. A driver integrated circuit (IC) may control the transistors to implement a buck converter. By exposing a top surface of the exposed conductive clip outside of a mold compound of the package, enhanced thermal performance is provided. Additionally, the conductive clip provides a short distance, high current carrying route between transistors of the package, providing higher electrical performance and reduced form factor compared to conventional designs with individually packaged transistors.

20 Claims, 3 Drawing Sheets

(56) References Cited

U.S. PATENT DOCUMENTS

| | | |
|---|---|---|
| 7,663,211 B2 | 2/2010 | Noquil |
| 7,772,681 B2 | 8/2010 | Joshi |
| 7,898,093 B1 | 3/2011 | Darveaux |
| 7,902,809 B2 | 3/2011 | Briere |
| 8,344,464 B2 | 1/2013 | Cho |
| 2005/0161785 A1 | 7/2005 | Kawashima |
| 2007/0249092 A1 | 10/2007 | Joshi |
| 2011/0080156 A1 | 4/2011 | Briere |

MULTI-TRANSISTOR EXPOSED CONDUCTIVE CLIP FOR SEMICONDUCTOR PACKAGES

This is a continuation of application Ser. No. 13/111,712 filed May 19, 2011.

BACKGROUND OF THE INVENTION

1. Field of the Invention

The present invention relates generally to semiconductor devices. More particularly, the present invention relates to packaging of semiconductor devices.

2. Background Art

Optimization of electrical and thermal performance is an important consideration for high frequency, high voltage power applications. It is known to use a conductive clip to provide a high performance interconnect between a transistor and input/output terminals within a package. Additionally, by exposing the conductive clip to the outside of the package, enhanced thermal dissipation may be provided, for example by affixing a heat sink to the exposed area of the conductive clip.

In high power circuit applications, such as half-bridge based DC-DC converters or buck converters, multiple transistors are required. Additionally, a driver integrated circuit (IC) (or a "gate driver") is necessary to drive and control the transistors.

Conventionally, the driver IC and the transistors may be individually packaged and disposed on a shared support surface, such as a printed circuit board (PCB). However, the routing of current lines through the PCB negatively affects electrical performance, and the form factor of the individual packages requires significant area to be reserved on the PCB, adding cost and complexity.

Thus, a unique and cost-effective solution is needed to support the efficient design and operation of high power circuit applications, such as buck converters, while providing enhanced thermal dissipation and a compact form factor.

SUMMARY OF THE INVENTION

A multi-transistor exposed conductive clip for high power semiconductor packages, substantially as shown in and/or described in connection with at least one of the figures, and as set forth more completely in the claims.

DETAILED DESCRIPTION OF THE INVENTION

The present application is directed to a multi-transistor exposed conductive clip for high power semiconductor packages. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1A:
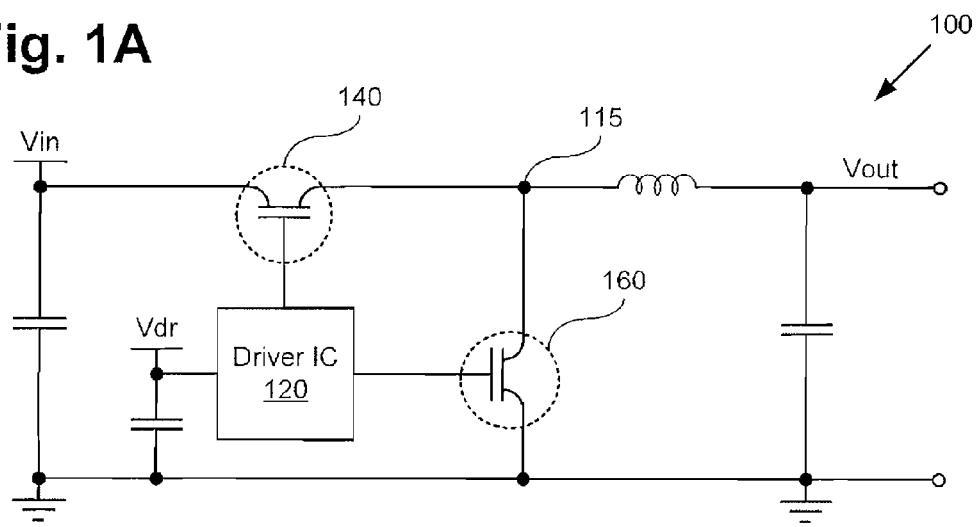
FIG. 1A illustrates a circuit diagram of a buck converter using a half-bridge topology.

FIG. 1A illustrates a circuit diagram of a buck converter using a half-bridge topology. Diagram 100 includes switched node 115, driver integrated circuit (IC) 120, control transistor 140 (also referred to as a "control switch" or a "control FET"), and synchronous transistor 160 (also referred to as a "synchronous switch," a "sync switch," a "synchronous FET," or a "sync FET"). The source of control transistor 140 is coupled to the drain of sync transistor 160 at switched node 115. Driver IC 120 operates on voltage Vdr and controls the duty cycles of control transistor 140 and sync transistor 160, thereby converting the input voltage Vin to a specific output voltage Vout. Control transistor 140 and sync transistor 160 may each comprise a conventional field effect transistor (FET) switch, for example a silicon FET. However, control transistor 140 and sync transistor 160 may each also comprise a non-silicon FET or any other FET in general. Alternatively, one or both of control transistor 140 and sync transistor 160 may also comprise a III-nitride transistor.

Figure 1B:
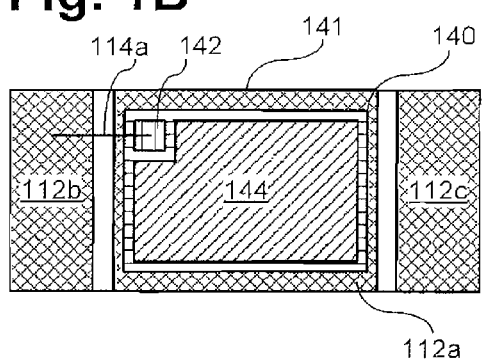
FIG. 1B illustrates a top view of a conventional semiconductor package.

To implement the buck converter of diagram 100 in FIG. 1A, it is known to package driver IC 120, control transistor 140, and sync transistor 160 into separate packages and connect them on a support surface such as a printed circuit board (PCB). Turning to FIG. 1B, FIG. 1B illustrates a top view of a conventional semiconductor package. FIG. 1B includes package 141, which may comprise, for example, a quad flat no-leads (QFN) package. Package 141 includes pads 112a, 112b, and 112c, wirebond 114a, and control transistor 140. Pads 112a, 112b, and 112c may comprise pads of a substrate, such as, but not limited to, a printed circuit board (PCB), a ceramic substrate, direct bonded copper (DBC), or a leadframe. Control transistor 140, which may correspond to control transistor 140 from FIG. 1A, is disposed on pad 112a and includes a top surface having a control gate 142 and a control source 144 and a bottom surface (not shown) having a control drain 146. Control gate 142 is coupled to pad 112b through wirebond 114a. A similar package 161 (not shown) may also be fabricated by substituting sync transistor 160 for control transistor 140.

Figure 1D:
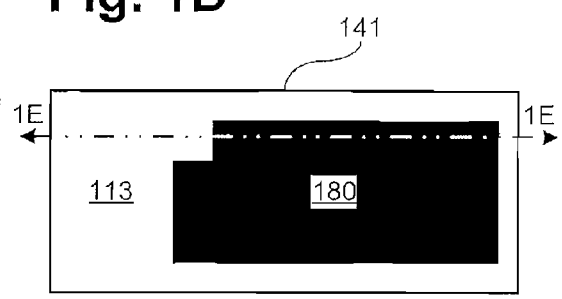
FIG. 1D illustrates a top view of a conventional semiconductor package with an exposed conductive clip.
Figure 1C:
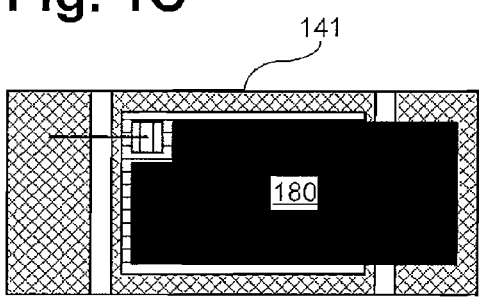
FIG. 1C illustrates a top view of a conventional semiconductor package with a conductive clip.

Moving to FIG. 1C, FIG. 1C illustrates a top view of a conventional semiconductor package with a conductive clip. FIG. 1C includes package 141. Comparing FIG. 1C with FIG. 1B, FIG. 1C adds a conductive clip 180 to package 141 of FIG. 1B. Conductive clip 180 is coupled to pad 112c and control source 144.

Turning to FIG. 1D, FIG. 1D illustrates a top view of a conventional semiconductor package with an exposed conductive clip. FIG. 1D includes package 141. Comparing FIG. 1D with FIG. 1C, FIG. 1D adds an encapsulating mold compound 113 to package 141 of FIG. 1C. As shown in FIG. 1D, the mold compound 113 is formed such that a top surface of conductive clip 180 is exposed, thereby resulting in an exposed conductive clip 180. For example, the top surface of package 141 may be abutted against an inner wall of a top pocket of a mold used to shape mold compound 113. Exposed conductive clip 180 may provide enhanced thermal dissipation by radiating heat directly to ambient air or to an attached heat sink. The thermal performance of package 141 may comprise an important long-term reliability consideration, particularly for high power applications.

Figure 1E:
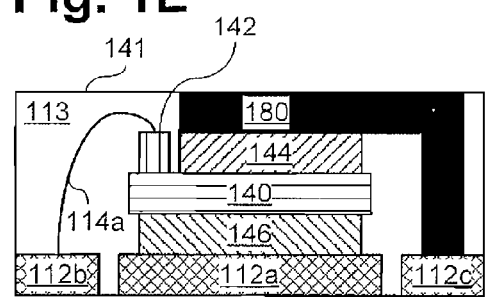
FIG. 1E illustrates a cross sectional view of a conventional semiconductor package with an exposed conductive clip.

FIG. 1E illustrates a cross sectional view of a conventional semiconductor package with an exposed conductive clip. The cross section shown in FIG. 1E may correspond to the cross sectional line indicated by line 1E-1E of FIG. 1D. FIG. 1E includes package 141, which includes pads 112a, 112b, and 112c, control transistor 140 disposed on pad 112a and having a bottom surface including a control drain 146 and a top surface including a control gate 142 and a control source 144, a wirebond 114a coupling control gate 142 to pad 112b, and an exposed conductive clip 180 coupled to control source 144 and pad 112c.

Figure 1F:
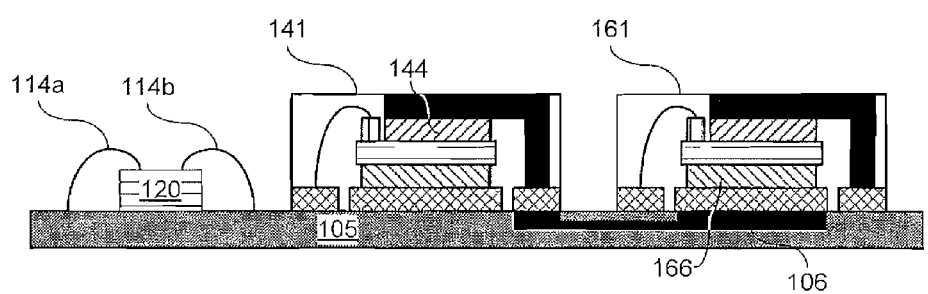
FIG. 1F illustrates a cross sectional view of a conventional buck converter mounted on a printed circuit board.

Addressing FIG. 1F, FIG. 1F illustrates a cross sectional view of a conventional buck converter mounted on a printed circuit board. FIG. 1F includes a substrate 105, which may comprise a printed circuit board (PCB). Driver IC 120, package 141, and package 161 are disposed on substrate 105. Package 141 may correspond to package 141 as illustrated in FIG. 1D and FIG. 1E. Package 161 may also have a similar composition, substituting sync transistor 160 for control transistor 140. Wirebonds 114a and 114b may connect to pads on substrate 105 and further routed to respective gate terminals of packages 141 and 161. Trace 106 in substrate 105 may connect the control source 144 of package 141 to the sync drain 166 of package 161. Thus, FIG. 1F may implement the buck converter in diagram 100 of FIG. 1A.

However, a significant portion of substrate 105 is utilized to implement the buck converter in diagram 100 of FIG. 1A. More specifically, lateral space must be reserved for driver IC, package 141, package 161, vertical space must be reserved for wirebonds 114a and 114b, and various interconnects must be provided within substrate 105, such as trace 106. As a result, implementing the buck converter of FIG. 1A using the conventional design of FIG. 1F undesirably increases form factor, complexity, and cost.

Figure 2A:
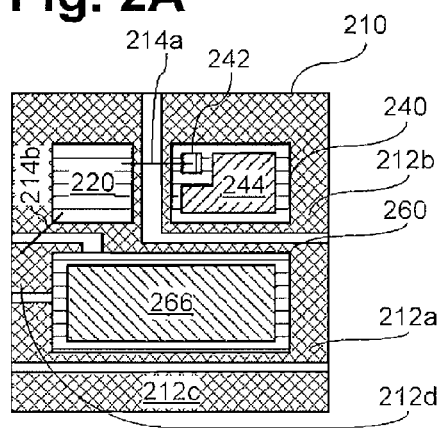
FIG. 2A illustrates a top view of a high power semiconductor package according to an embodiment of the invention.

Turning to FIG. 2A, FIG. 2A illustrates a top view of a high power semiconductor package according to an embodiment of the invention. FIG. 2A includes package 210, which may comprise a QFN or another leadless package and includes driver IC 220 disposed on pad 212a, control transistor 240 disposed on pad 212b, and sync transistor 260 disposed on pads 212a and 212d. Pad 212c is not connected in FIG. 2A. Pads 212a through 212d may comprise pads of a substrate, such as, but not limited to, a printed circuit board (PCB), a ceramic substrate, direct bonded copper (DBC), or a leadframe. As shown in FIG. 2A, control transistor 240 is oriented such that a control gate 242 and a control source 244 are disposed on a top surface thereof, with a control drain 246 (not shown) disposed on a bottom surface thereof. Conversely, sync transistor 260 is oriented such that a sync gate 262 (not shown) and a sync source 264 (not shown) are disposed on a bottom surface thereof, with a sync drain 266 disposed on a top surface thereof. Wirebond 214a couples control gate 242 to driver IC 220, and wirebond 212b couples sync gate 262 to driver IC 220 through pad 212d.

While package 210 in FIG. 2A is shown with continuous pad perimeters for simplicity, in alternative embodiments the perimeters of package 210 may be separated into distinct pads. For example, pad 212a may comprise several individual pads to accommodate additional wirebond inputs and outputs for driver IC 220. Pad 212b and 212d may also be divided into separate pad sections. Additionally, it is noted that in various embodiments of the present invention, one or both of control transistor 240 and sync transistor 260 can be depletion mode transistors, for example, III-nitride depletion mode transistors. Furthermore, while two transistors are utilized in package 210 of FIG. 2A, alternative embodiments may also utilize more than two transistors.

Figure 2D:
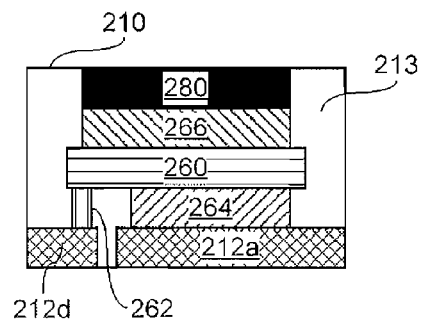
FIG. 2D illustrates a cross sectional view of a high power semiconductor package according to an embodiment of the invention.
Figure 2B:
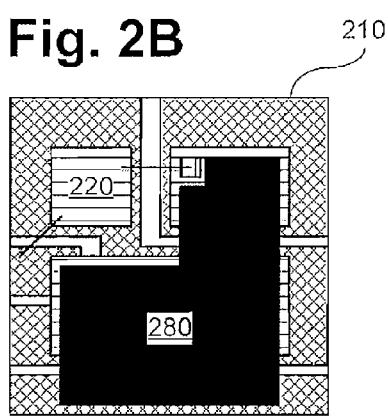
FIG. 2B illustrates a top view of a high power semiconductor package with a multi-transistor conductive clip according to an embodiment of the invention.

Turning to FIG. 2B, FIG. 2B illustrates a top view of a high power semiconductor package with a multi-transistor conductive clip according to an embodiment of the invention. Comparing FIG. 2B with FIG. 2A, FIG. 2B adds a conductive clip 280 to package 210 of FIG. 2A. Conductive clip 280 may comprise any highly conductive material, including a metal such as copper or a metallic alloy, and is coupled to pad 212c, sync drain 266, and control source 244, for example by solder, conductive adhesive, or another attach material. Accordingly, conductive clip 280 electrically couples control source 244 to sync drain 266, corresponding to node 115 in FIG. 1A. Thus, the layout of package 210 in FIG. 2B connects driver IC 220, control transistor 240, and sync transistor 260 as shown in diagram 100 of FIG. 1A.

Figure 2E:
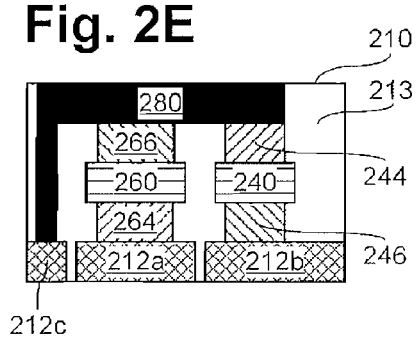
FIG. 2E illustrates a cross sectional view of a high power semiconductor package according to an embodiment of the invention.
Figure 2C:
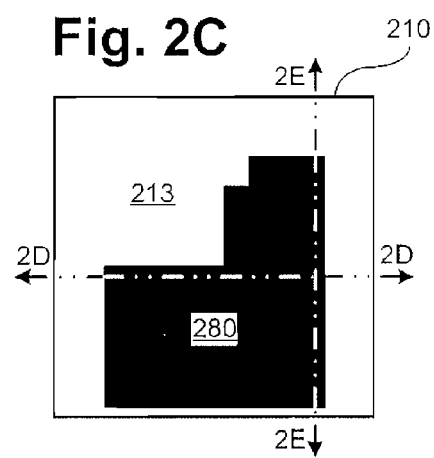
FIG. 2C illustrates a top view of a high power semiconductor package with a multi-transistor exposed conductive clip according to an embodiment of the invention.

With respect to FIG. 2C, FIG. 2C illustrates a top view of a high power semiconductor package with a multi-transistor exposed conductive clip according to an embodiment of the invention. Comparing FIG. 2C with FIG. 2B, a mold compound 213 is formed over control transistor 240 and sync transistor 260 without covering a top surface of conductive clip 280 from FIG. 2B so as to form an exposed conductive clip 280 in FIG. 2C. For example, the top surface of package 210 may be abutted against an inner wall of a top pocket of a mold used to shape mold compound 213.

In alternative embodiments, conductive clip 280 may comprise a plurality of stacked clips rather than a single clip, allowing package 210 to extend higher while still exposing conductive clip 280, for example to provide sufficient clearance for wirebonds 214a and 214b. Alternatively, driver IC 220 may comprise a flip chip rather than a wirebonded IC, in which case driver IC 220 may also be exposed through mold compound 213 in a similar manner as exposed conductive clip 280, thereby providing enhanced thermal performance. Optionally, a heat sink may be affixed to an exposed portion of exposed conductive clip 280 and/or driver IC 220.

Moving to FIG. 2D, FIG. 2D illustrates a cross sectional view of a high power semiconductor package according to an embodiment of the invention. The cross section shown in FIG. 2D may correspond to the cross sectional line indicated by line 2D-2D of FIG. 2C. As shown in FIG. 2D, package 210 includes pad 212d and 212a. A bottom surface of sync transistor 260 includes sync gate 262 disposed on pad 212d and sync source 264 disposed on pad 212a. A top surface of sync transistor 260 includes sync drain 266, which is coupled to exposed conductive clip 280. Package 210 is encapsulated within mold compound 213, which does not cover the top surface of exposed conductive clip 280.

Discussing FIG. 2E, FIG. 2E illustrates a cross sectional view of a high power semiconductor package according to an embodiment of the invention. The cross section shown in FIG. 2E may correspond to the cross sectional line indicated by line 2E-2E of FIG. 2C. As shown in FIG. 2E, package 210 includes pads 212c, 212a, and 212b. A bottom surface of sync transistor 260 includes sync source 264 disposed on pad 212a. A top surface of sync transistor 260 includes sync drain 266, which is coupled to exposed conductive clip 280. A bottom surface of control transistor 240 includes control drain 246 disposed on pad 212b. A top surface of control transistor 240 includes control source 244, which is coupled to exposed conductive clip 280. Thus, exposed conductive clip 280 electrically and mechanically couples pad 212c, sync drain 266, and control source 244. By coupling sync drain 266 and control source 244 through a low resistance, short distance path while also being exposed to the outside of package 210, exposed conductive clip 280 provides an efficient current path between sync transistor 260 and control transistor 240 while providing enhanced thermal performance and reduced package form factor.

Figure 2F:
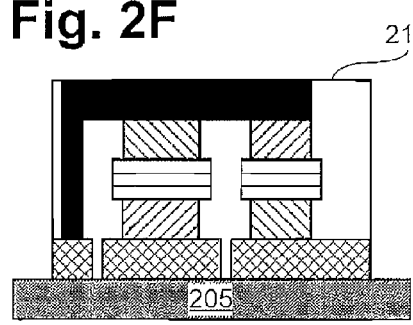
FIG. 2F illustrates a cross sectional view of a buck converter mounted on a printed circuit board according to an embodiment of the invention.

The advantages of the reduced package form factor provided by package 210 are further emphasized in FIG. 2F, which illustrates a cross sectional view of a buck converter mounted on a printed circuit board according to an embodiment of the invention. Since package 210 as illustrated in FIGS. 2C, 2D, and 2E already implements the buck converter of diagram 100 in FIG. 1A, no additional components are required. Thus, package 210 is simply mounted to support surface 205, such as printed circuit board. The reduced package form factor provided by package 210 is especially evident when comparing to the conventional design shown in FIG. 1F, where driver IC 120, package 141, and package 161 are separately mounted to substrate 105. The efficient design of exposed conductive clip 280, where multiple transistors are coupled together and thermally exposed in a single package, provides package 210 with enhanced thermal and electrical performance suitable for high power applications.

Thus, a multi-transistor exposed conductive clip for a high power semiconductor package has been described. According to the present invention, by using an exposed conductive clip 280 that is coupled to multiple transistors to implement a desired circuit, such as a buck converter, a thermally and electrically enhanced semiconductor package may be provided for high power applications while optimizing package form factor compared to conventional packages.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor package comprising:
   at least two transistors including a control transistor having a control source on a top surface thereof and a sync transistor having a sync drain on a top surface thereof;
   a driver integrated circuit (IC) coupled to said at least two transistors;
   a single exposed conductive clip coupled directly to said control source and directly to said sync drain and directly to a pad in the semiconductor package.

2. The semiconductor package of claim 1 further comprising a mold compound enclosing said at least two transistors without covering a top surface of said exposed conductive clip.

3. The semiconductor package of claim 1, wherein said driver IC is coupled to a sync gate of said sync transistor by at least one wirebond.

4. The semiconductor package of claim 1, wherein said driver IC is coupled to a control gate of said control transistor by at least one wirebond.

5. The semiconductor package of claim 1, wherein said driver IC is coupled to a sync gate of said syn transistor and to a control gate of said control transistor through respective wirebonds.

6. The semiconductor package of claim 1, wherein said control transistor is a field effect transistor (FET).

7. The semiconductor package of claim 1, wherein said sync transistor is a field effect transistor (FET).

8. The semiconductor package of claim 1, wherein said driver IC is a flip chip.

9. The semiconductor package of claim 2, wherein said mold compound encloses said driver IC without covering a top surface of said driver IC.

10. The semiconductor package of claim 1, wherein said package comprises a buck converter.

11. The semiconductor package of claim 1, wherein said exposed conductive clip is further attached to a leadframe pad of said package.

12. The semiconductor package of claim 1, wherein said exposed conductive clip comprises a plurality of stacked clips.

13. The semiconductor package of claim 1, wherein said package is a leadless package.

14. The semiconductor package of claim 1, wherein said at least two transistors include a III-nitride transistor.

15. A semiconductor package comprising:
   a control transistor including a top surface having a control gate and a control source;
   a sync transistor including a top surface having a sync drain and a bottom surface including a sync gate;
   a driver integrated circuit (IC) coupled to said control gate and said sync gate;
   a single exposed conductive clip coupled directly to said control source and directly to said sync drain and directly to a pad in said semiconductor package.

16. The semiconductor package of claim 15 further comprising a mold compound enclosing said control transistor and said sync transistor without covering a top surface of said exposed conductive clip.

17. The semiconductor package of claim 15, wherein said driver IC is coupled to said sync gate and to said control gate through respective wirebonds.

18. The semiconductor package of claim 15, wherein said control transistor and said sync transistor are field effect transistors (FETs).

19. The semiconductor package of claim 15, wherein said driver IC is a flip chip.

20. The semiconductor package of claim 15, wherein said mold compound encloses said driver IC without covering a top surface of said driver IC.

* * * * *